United States Patent [19]

Torikai

[11] Patent Number: 4,974,061
[45] Date of Patent: Nov. 27, 1990

[54] PLANAR TYPE HETEROSTRUCTURE AVALANCHE PHOTODIODE

[75] Inventor: Toshitaka Torikai, Tokyo, Japan

[73] Assignee: NEC Corporation, Tokyo, Japan

[21] Appl. No.: 234,059

[22] Filed: Aug. 19, 1988

[30] Foreign Application Priority Data

Aug. 19, 1987 [JP] Japan .................. 62-206113
Aug. 19, 1987 [JP] Japan .................. 62-206114

[51] Int. Cl.$^5$ ............................ H01L 27/14
[52] U.S. Cl. ........................ 357/30; 357/16; 357/52; 357/90
[58] Field of Search ............ 357/30 A, 30 E, 90, 357/30 D, 30 B, 30 P, 16, 17, 52

[56] References Cited

U.S. PATENT DOCUMENTS

| 4,140,559 | 2/1979 | Van Vonno | 357/90 |
| 4,383,266 | 5/1983 | Sakai et al. | 357/30 A |
| 4,383,269 | 5/1983 | Capasso | 357/90 |
| 4,599,632 | 7/1986 | Bethea et al. | 357/30 E |
| 4,651,187 | 3/1987 | Sugimoto et al. | 357/30 A |
| 4,684,969 | 8/1987 | Taguchi | 357/30 A |
| 4,701,773 | 10/1987 | Kaneda et al. | 357/30 A |

FOREIGN PATENT DOCUMENTS

| 0127724 | 12/1984 | European Pat. Off. | 357/30 E |
| 0205899 | 12/1986 | European Pat. Off. | 357/16 |
| 0093584 | 6/1982 | Japan | 357/30 A |
| 58-108778 | 6/1983 | Japan | 357/52 |
| 0215084 | 12/1983 | Japan | 357/30 A |
| 0136981 | 8/1984 | Japan | 357/30 E |
| 0151475 | 8/1984 | Japan | 357/30 A |
| 59-232470 | 12/1984 | Japan | 357/16 |
| 0056468 | 3/1986 | Japan | 357/30 A |
| 61-289678 | 12/1986 | Japan | 357/30 A |
| 62-26871 | 2/1987 | Japan | 357/30 A |
| 2115610 | 9/1983 | United Kingdom | 357/30 A |

OTHER PUBLICATIONS

Chi et al., "Planar InP/InGaAsP . . . Photodiode", IEEE, vol. Ed.-34, No. 11, 11/1987.

Primary Examiner—Rolf Hille
Assistant Examiner—Minh Loan Tran
Attorney, Agent, or Firm—Sughrue, Mion, Zinn, Macpeak & Seas

[57] ABSTRACT

A planar type heterostructure avalanche photodiode comprises first and second semiconductor layers having first and second forbidden energy gaps. The second forbidden energy gap is larger than the first forbidden energy gap. In the second semiconductor layer, the second forbidden energy gap is increased as a distance is increased from a hetero-interface between the first and second semiconductor layers, and a pn junction is provided. A cross sectional shape of the outer periphery of the pn junction is defined by a curvature dependent on the increase of the second forbidden energy gap.

4 Claims, 2 Drawing Sheets

4,974,061

PLANAR TYPE HETEROSTRUCTURE AVALANCHE PHOTODIODE

FIELD OF THE INVENTION

The invention relates to a planar type heterostructure avalanche photodiode, and more particularly to a planar type heterostructure avalanche photodiode which is provided with a guard-ring in a multiplication layer.

BACKGROUND OF THE INVENTION

These days, the development of an avalanche photodiode which is fabricated from $In_{0.53}Ga_{0.47}As$ compound semiconductor has been promoted. Such an avalanche photodiode can be applied to an optical fiber transmission system in which 1 to 1.6 μm wavelength region is dominantly used to transmit an optical information through an optical fiber with a low transmission loss. Since the InGaAs semiconductor is lattice-matched to a wide energy gap InP semiconductor, heterostructure comprising with the InGaAs and InP can be obtained. In the heterostructure, the InGaAs semiconductor is for a light absorption layer, and the InP layer is for an avalanche multiplication layer into which either electrons or holes generated in the light absorption layer inject to produce the avalanche multiplication. Using such separated absorption and nultiplication structure, a photo detector can be realized with an excellent receiving sensitivity.

The concept as described above has been described on pages 251 to 253 of "Appl. Phys. Lett. Vol. 35, 1979" by K. Nishida et al. An avalanche photodiode fabricated in accordance with the concept will be explained in detail later.

According to the avalanche photodiode, however, there is a disadvantage that it is difficult to provide a guard-ring effect by which an edge breakdown is prevented from being occurred at an outer peripheral edge of a p+-conduction region selectively formed in a multiplication layer, although the reason thereof will be also explained later.

SUMMARY OF THE INVENTION

Accordingly, it is an object of the invention to provide a planar type heterostructure avalanche photodiode in which a guard-ring effect can be obtained without inviting the aforementioned edge breakdown.

According to the invention, a planar type heterostructure avalanche photodiode comprises a heterostructure having first and second semiconductor layers of different forbidden energy gaps wherein the first semiconductor layer is used for a light absorption layer, and the second semiconductor layer is used for an avalanche multiplication layer. In the second semiconductor layer, a pn junction is selectively provided, and the forbidden energy gap is wider than that of the first semiconductor layer and is increased as a distance is increased from a heterointerface between the first and second semiconductor layers.

BRIEF DESCRIPTION OF DRAWINGS

The invention will be explained in more detail in conjunction with appended drawings wherein.

DESCRIPTION OF PREFERRED EMBODIMENTS

Figure 1:
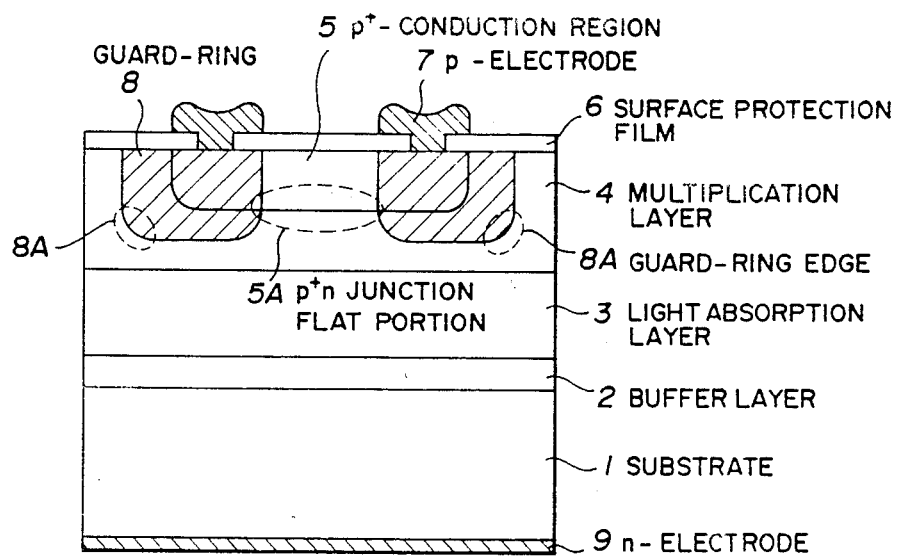
FIG. 1 is a conventional planar type heterostructure avalanche photodiode.

Before describing a planar type heterostructure avalanche photodiode according to the invention, a conventional avalanche photodiode which is fabricated in accordance with the aforementioned concept will be explained. FIG. 1 shows a cross-sectional view of the conventional avalanche photodiode which comprises a buffer layer 2 of n-InP, a light absorption layer 3 of $n^--In_{0.53}Ga_{0.47}As$ and an n-InP layer 4 successively grown on a substrate 1 of $n^+$-InP, a $p^+$-conduction region 5 formed into the n-InP layer 4 to a predetermined depth to provide a multiplication layer, a guard-ring 8 formed into the n-InP layer 4 to encircle the outer peripheral edge of the $p^+$-conduction region 5, a surface protection film 6 having a function of anti-reflection provided on the n-InP layer 4, a p-electrode 7 in contact with the $p^+$-conduction region 5 through an aperture of the surface protection film 6, and an n-electrode 9 formed on the back surface of the substrate 1 wherein a forbidden energy gap of the n-InP layer 4 is wider than that of the light absorption layer 3.

In the avalanche photodiode, a reverse bias voltage is applied across the p and n-electrodes 7 and 9 to extend a depletion layer into the light absorption layer 3 with the narrow forbidden energy gap so that light is absorbed therein thereby transferring only hole carriers generated therein to the pn junction in the n-InP 4 with the large forbidden energy gap to give rise to the avalanche multiplication. In other words, a photo-detector with low dark current performance can be obtained, because the dark current due to the tunneling process in the narrow energy gap InGaAs layer is suppressed and a voltage breakdown is occurred in the n-InP layer 4 with the wide forbidden energy gap.

However, there is the aforementioned disadvantage for the following reason. That is to say, the purpose of providing the guard-ring 8 which encircle the outer peripheral edge of the $p^+$-conduction region 5 is to prevents a local voltage breakdown which is liable to occur at the outer peripheral edge so that an uniform avalanche multiplication is obtained in a flat portion 5A of the $p^+n$ junction. On the contrary, it is difficult to obtain such a guard-ring effect because an edge breakdown is occurred at the outer peripheral edge 8A of the guard-ring 8 when the avalanche gain is approximately less than ten. As shown in FIG. 1, the junction position of the guard-ring 8 is nearer the light absorption layer 3 than that of the $p^+$-conduction region 5, and thus the strength of electric field is greater at the hetero-interface under the guard-ring 8 than at the hetero-interface under the $p^+$-conduction region 5. Therefore, a voltage breakdown in the light absorption layer 3 with the narrow forbidden energy gap deteriorates the guard-ring effect. In more detail, the influence of the breakdown is strongest on the outer peripheral edge 8A of the guard-ring 8 so that a breakdown is occurred at the outer peripheral edge 8A earlier than at the flat portion 5A of the $p^+$-conduction region 5. This is the aforementioned disadvantage.

Next, a planar type heterostructure avalanche photodiode in a first embodiment according to the invention will be explained in conjunction with FIG. 2. The planar type heterostructure avalanche photodiode comprises a buffer layer 2 of n-InAlAs having a thickness of approximately 1 μm, a light absorption layer 3 of n$^-$-In$_{0.53}$Ga$_{0.47}$As having a thickness of approximately 3 μm and a carrier density of 3 to 5×10$^{15}$cm$^{-3}$, and a graded forbidden energy gap layer 14 of In$_{0.53}$(Ga$_{1-x}$-Al$_x$)$_{0.47}$As having a thickness of 2.5 to 3.0 μm and a carrier density of 1 to 2×10$^{16}$cm$^{-3}$ in which a forbidden energy gap is graded from 1.0eV to 1.4eV successively grown on a substrate 1 of n$^+$-InP doped with Sulfur. The buffer layer 2 eliminates the dislocation and defect propagation from the substrate to epitaxial layers, and the graded forbidden energy gap layer 14 is for an avalanche multiplication layer and a window layer for light having a wavelength of 1.0 to 1.6 μm. In the graded forbidden energy gap layer 14, a p$^+$-conduction region 5 having a plane round or oval shape as viewed from above and a guard-ring 8 encircling the outer peripheral edge of the p$^+$-conduction region 5 are selectively provided. Further, a ring shaped p-electrode 7 is provided to be in contact with the p$^+$-conduction region 5 through an aperture of a surface protection film 6 on the graded forbidden energy gap layer 14, and an n-electrode 9 is formed over the back surface of the substrate 1.

The above epitaxial layers 2 to 4 are grown at a temperature of 700° C. by metalorganic vapor phase epitaxy. The elements of In, Ga and Al are obtained from organicmetals of tri-methyl-indium (TMI), tri-ethyl-gallium (TEG) and tri-methyl-aluminum (TMA) respectively. The materials of As and P are made from source gases of arsine (AsH$_3$) and phosphine (PH$_3$) respectively. A mask of a resist film is formed on the wafer surface of the epitaxial layer by the normal light exposure technique, and then Be-ions are implanted into the graded forbidden energy gap layer 14 through the mask under the conditions of 3 to 5×10$^{13}$cm$^{-2}$ dose and an acceleration energy of 100 to 150 kV. After the ion-implantation, the mask is removed from the wafer surface which is then annealed at a temperature of 700° C. for 10 to 20 minutes to provide the guard-ring 8 of p-conduction region. At this process, the greater a forbidden energy gap of a semiconductor layer is, the more extensive Be is diffused thereinto so that the guard-ring 8 is of a cross section having a curvature-relieved shape. After the formation of the guard-ring 8, a film of SiO$_2$ is deposited on the wafer surface by chemical vapor deposition process to provide the p$^+$-conduction region 5. Then, the SiO$_2$ film is patterned by the normal light exposure process. After that, Zn for the p$^+$-conduction region 5 is diffused to the prescribed depth through the patterned SiO$_2$ film into the graded forbidden energy gap layer 14. The surface protection film 6 is of silicon nitride (SiNx) which is deposited on the graded forbidden energy gap layer 14 by plasma enhanced chemical vapor deposition. The p-electrode 7 is of a multi-layered film of Ti/Pt/Au which are formed by electron bombardment evaporation. Finally the n-electrode 9 of a AuGe film is formed by resistive heating evaporation to finish the avalanche photodiode as shown in FIG. 2.

Here, a planar type heterostructure avalanche photodiode according to the invention will be again explained, especially, in its principle.

Figure 2:
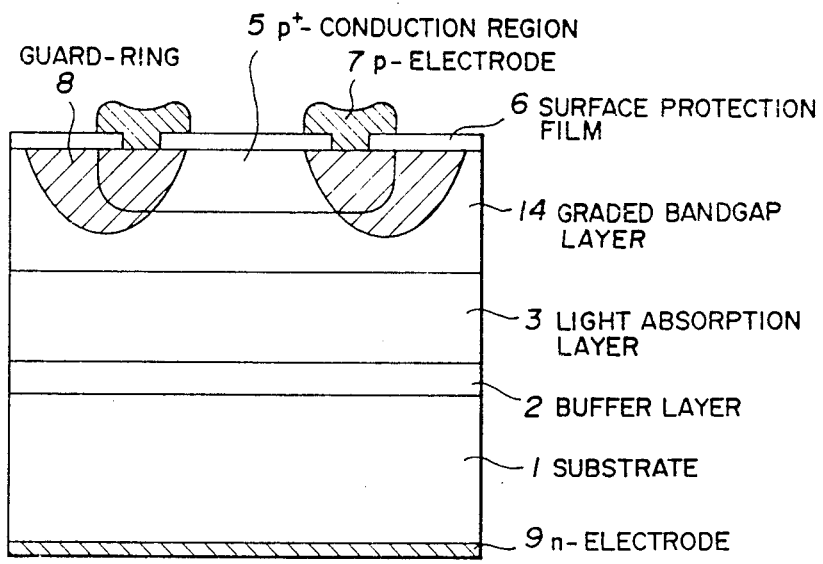
FIG. 2 is a planar type heterostructure avalanche photodiode in a first embodiment according to the invention.

As shown in FIG. 2, the curvature at the peripheral edge of the guard-ring 8 is relieved to some extent. As a result, a breakdown voltage of the guard-ring 8 is heightened by itself. A forbidden energy gap of the layer 14 is increased in its value with a predetermined inclination as the distance is increased from the light absorption layer 3. This results in a cross sectional shape of a relieved curvature in the guard-ring 8 as shown in FIG. 2, as compared to the conventional avalanche photodiode as shown in FIG. 1. As explained before, in a case where p-type impurities are diffused or ion-implanted into an n-conduction region, the greater a forbidden energy gap of the n-conduction region is, the more it is difficult that semiconductor composition atoms are replaced by (p-) impurities, in general, for the reason why a bond energy is high among the semiconductor composition atoms. The p-conduction region is formed by a mechanism in which the p-type impurities diffuse among the semiconductor composition atoms and a mechanism in which the semiconductor composition atoms are replaced by the p-type impurities wherein the two mechanisms are repeated alternately. The greater a forbidden energy gap of a semiconductor is, the lower a rate in which impurities are stabilized by substituting for semiconductor composition atoms is, so that the mechanism for the diffusion of the p-type impurities among the semiconductor composition atoms is more dominant than the mechanism for the substitution of the semiconductor composition atoms. That is to say, the greater a forbidden energy gap of a semiconductor is, the more extensive the p-type impurities diffuse into the semiconductor. This phenomenon is applied to the planar type heterostructure avalanche photodiode as shown in FIG. 2. In a case where the p-type impurities diffuses vertically into the layer 14 from the upper surface thereof, a diffusing velocity becomes low gradually as a distance becomes large from the upper surface thereof because the forbidden energy gap becomes low. On the other hand, in a case where the p-impurities diffuses into the layer 14 in a parallel direction to the upper surface thereof, the diffusing velocity does not become low. Therefore, the diffusing distance of the p-type impurities is longer in the parallel direction than in the vertical direction. As a result, the guard-ring 8 of the p-conduction region having a cross section of a relieved curvature in which the diffusion of the p-type impurities is more expanded transversely is obtained as shown in FIG. 2.

Figure 3:
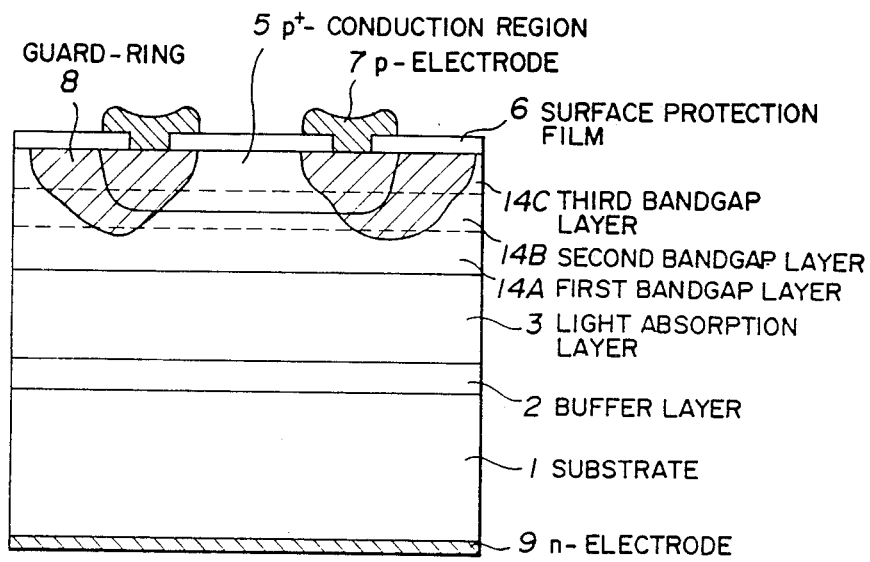
FIG. 3 is a planar type heterostructure avalanche photodiode in a second embodiment according to the invention.

Next, a planar type heterostructure avalanche photodiode in a second embodiment according to the invention is shown in FIG. 3 wherein like parts are indicated by like reference numerals in FIG. 2. The difference is that the planar type heterostructure avalanche photodiode in the second embodiment comprises first to third forbidden energy gap layers 14A, 14B and 14C in place of the graded forbidden energy gap layer 14 in FIG. 2. The first forbidden energy gap layer 14A is of In$_{0.53}$Ga$_{0.4}$Al$_{0.07}$As having a forbidden energy gap of 1eV, the second forbidden energy gap layer 14B is of In$_{0.53}$Ga$_{0.23}$Al$_{0.24}$As having a forbidden energy gap of 1.2eV, and the third forbidden energy gap 14C is of In$_{0.53}$Al$_{0.47}$As having a forbidden energy gap of 1.4eV. All of the three layers 14A, 14B and 14C are the same thickness of 0.7 to 1.0 μm and the same carrier density of 1 to 2×10$^{16}$cm$^{-3}$. As a result, a cross sectional shape of a guard-ring 8 becomes a shape of three different curvature lines which are connected to each other continuously at points crossing two dotted lines for indicating boundary surfaces of the three layers 14A, 14B and 14C, as understood from the aforementioned principle.

As apparent from the first and second embodiments, the so-called guard-ring effect is remarkably improved as compared to the conventional avalanche photodiode. That is to say, a curvature of the guard-rings is higher in FIG. 1 than in FIGS. 2 and 3. Consequently, an breakdown voltage difference is equal to or less than only approximately 5V between the portions 5A and 8A in FIG. 1, and the maximum avalanche gain is limited only approximately less than ten for the conventional avalanche photodiode. However, it is expected in the invention that the breakdown voltage difference is increased up to 20 to 30V, and the maximum avalanche gain is more than forty.

Although the invention has been described with respect to specific embodiment for complete and clear disclosure, the appended claims are not to thus limited but are to be construed as embodying all modification and alternative constructions that may occur to one skilled in the art which fairly fall within the basic teaching herein set forth.

What is claimed is:

1. A planar type heterostructure avalanche photodiode, comprising:
    a first, n-type light absorption semiconductor layer having a first forbidden energy gap;
    a second, n-type avalanche-multiplication semiconductor layer forming a heterointerface with said first semiconductor layer and having a second forbidden energy gap larger than said first forbidden energy gap, said second forbidden energy gap increasing in value in a direction away from said heterojunction;
    at least one region in said second semiconductor layer forming a pn junction with said second semiconductor layer, said at least one region having an outer periphery having a curvature varying in dependence on said second forbidden energy gap; and
    first and second electrodes for applying a predetermined voltage across said first and second semiconductor layers.

2. A planar type heterostructure avalanche photodiode, according to claim 1, wherein:
    said at least one region comprises a $p^+$-type conduction region forming a $p^+n$ junction with said second semiconductor layer, and a p-type guard-ring defining said outer periphery of said at least one region, encircling an outer periphery of said $p^+$-type conduction region, and forming a pn junction with said second semiconductor layer.

3. A planar type heterostructure avalanche photodiode according to claim 1, wherein said value of said second forbidden energy gap increases linearly in said direction away from said heterojunction.

4. A planar type heterostructure avalanche photodiode according to claim 1, wherein said second semiconductor layer includes plural semiconductor layers having different forbidden energy gaps whereby said value of said forbidden energy gap increases in a stepwise manner in said direction away from said heterojunction.

* * * * *

UNITED STATES PATENT AND TRADEMARK OFFICE
CERTIFICATE OF CORRECTION

PATENT NO. : 4,974,061

DATED : November 27, 1990

INVENTOR(S) : Toshitaka Torikai

It is certified that error appears in the above-identified patent and that said Letters Patent is hereby corrected as shown below:

Col. 1, line 29, delete nultiplication", insert --multiplication--.

Col. 2, line 48, delete "prevents", insert --prevent--.

Signed and Sealed this

Ninth Day of June, 1992

Attest:

DOUGLAS B. COMER

Attesting Officer

Acting Commissioner of Patents and Trademarks